United States Patent
Murayama (10) Patent No.: US 7,524,025 B2
(45) Date of Patent: Apr. 28, 2009

(54) INKJET PRINTER

(75) Inventor: Kei Murayama, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 159 days.

(21) Appl. No.: 10/901,051

(22) Filed: Jul. 29, 2004

(65) Prior Publication Data

US 2005/0024424 A1 Feb. 3, 2005

(30) Foreign Application Priority Data

Jul. 31, 2003 (JP) ............................ 2003-283637

(51) Int. Cl.
- *B41J 2/04* (2006.01)
- *B41J 2/135* (2006.01)
- *B41J 2/17* (2006.01)
- *B41J 2/175* (2006.01)

(52) U.S. Cl. .............................. 347/54; 347/20; 347/44; 347/84

(58) Field of Classification Search ............. 347/84–85, 347/86, 30, 20, 44, 54
See application file for complete search history.

(56) References Cited

U.S. PATENT DOCUMENTS

| | | | |
|---|---|---|---|
| 4,106,032 A * | 8/1978 | Miura et al. .................. 347/21 |
| 4,914,522 A * | 4/1990 | Duffield et al. .............. 358/296 |
| 4,942,409 A * | 7/1990 | Paton et al. ................... 347/21 |
| 5,132,248 A | 7/1992 | Drummond et al. | |
| 5,144,332 A * | 9/1992 | Okuie .......................... 347/54 |
| 7,029,103 B2 * | 4/2006 | Iida .............................. 347/86 |
| 2003/0076649 A1 | 4/2003 | Speakman | |
| 2003/0081027 A1 * | 5/2003 | Feinn et al. .................... 347/12 |
| 2003/0081079 A1 * | 5/2003 | Mitsuhashi et al. ........... 347/68 |
| 2004/0017422 A1 * | 1/2004 | Katsuumi ...................... 347/30 |

FOREIGN PATENT DOCUMENTS

| EP | 1 149 706 | 10/2001 |
|---|---|---|
| EP | 1 170 135 | 1/2002 |
| WO | WO 95/12109 | 5/1995 |

* cited by examiner

*Primary Examiner*—Julian D Huffman
*Assistant Examiner*—Jason S Uhlenhake
(74) *Attorney, Agent, or Firm*—Staas & Halsey LLP (57) ABSTRACT

An inkjet printer which can be used for printing a resist pattern on a printed circuit board when wiring patterns are to be formed on the board. The inkjet printer has a liquid ejecting head which comprises: a liquid chamber filled with liquid and connected to a liquid storage tank; a capillary nozzle connected to the liquid chamber; a discharge unit for acting on the liquid filled in the liquid chamber to eject the liquid through an outlet of the capillary nozzle toward an object to be printed; and a negative pressure generating unit for applying a negative pressure in a direction in which the liquid is ejected from the outlet of the capillary nozzle. Due to the application of negative pressure, a liquid having a viscosity higher than that of a general ink can be ejected.

8 Claims, 8 Drawing Sheets

INKJET PRINTER

BACKGROUND OF THE INVENTION

1. Field of the Invention

The present invention relates to an inkjet printer for performing printing by discharging a liquid such as printing ink, or a liquid or paste-like resist material used in manufacturing printed wiring boards.

2. Description of the Related Art

Figure 8:
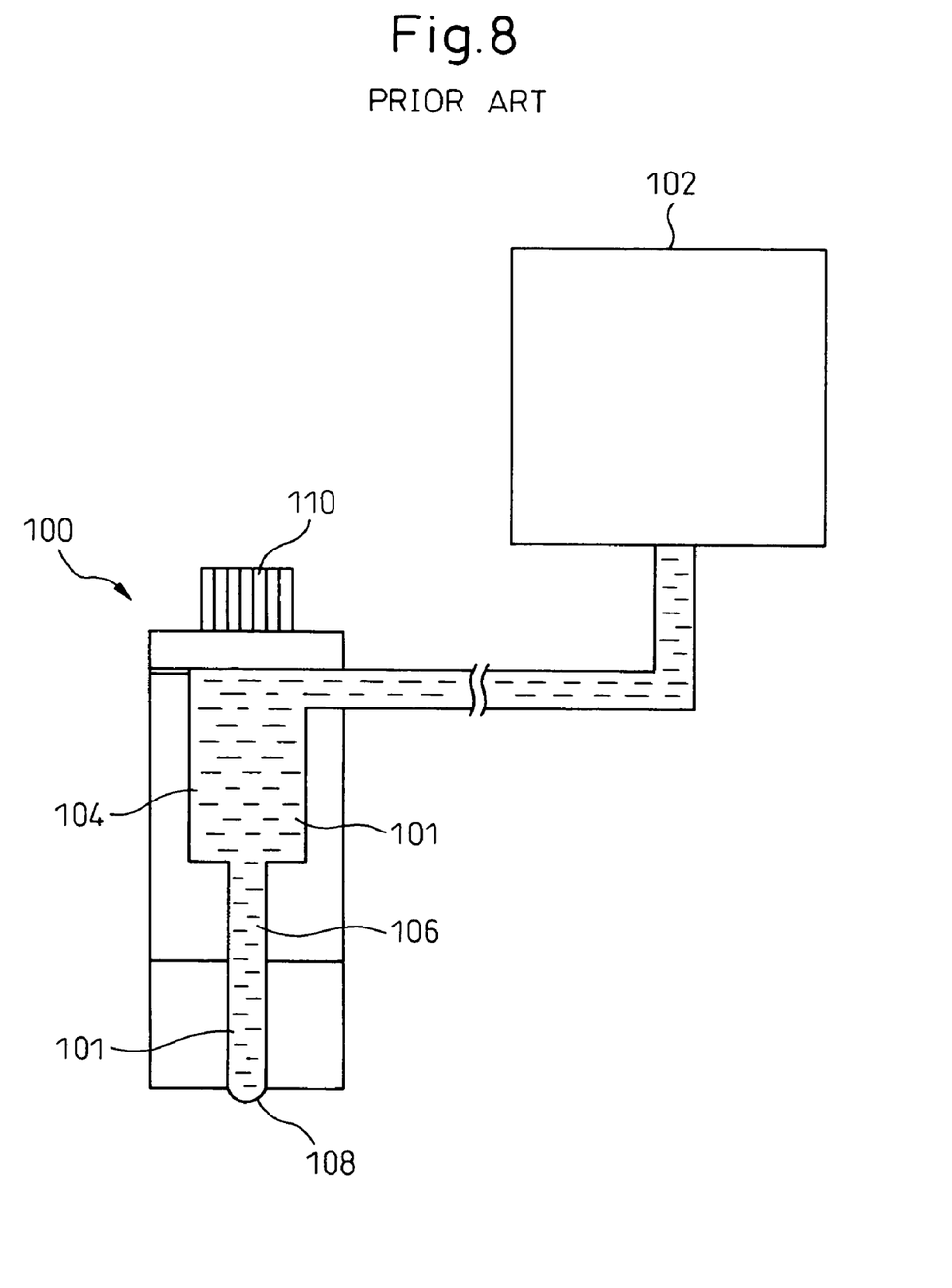
FIG. 8 is a schematic cross-sectional view showing a configuration of a conventional inkjet discharge head.

In general, as shown in FIG. 8, a known discharge head 100 used in an inkjet printer comprises: an ink chamber 104 that communicates with an ink tank 102 and that is filled with ink 101; and a piezoelectric element 110 that is deformed by energization to pressurize the ink 101 contained in the ink chamber 104 so that the ink 101 is discharged through a discharge port 108 of a capillary nozzle 106.

On the other hand, it has been proposed to form wiring patterns of printed wiring boards by inkjet printing.

More specifically, when a wiring pattern is formed on a board by etching a copper foil adhered to the board, a resist pattern is formed on the copper foil to cover an area corresponding to the wiring pattern. Conventionally, a photosensitive resist has been applied to a surface of the copper foil and, then, it is optically exposed and developed to form a resist pattern. However, it is cumbersome to form the resist pattern in this manner. Therefore, it is contemplated to form a wiring pattern by printing a resist material on the copper foil in a predetermined resist pattern using an inkjet printer.

However, when the printing is performed by discharging a paste-like resist material through the conventional discharge head 100 shown in FIG. 8, the resist material has a higher viscosity than the printing ink and is hard to discharge from the discharge port 108 and, therefore, it is difficult to eject the resist material efficiently and the resist material cannot be accurately printed on the copper foil in a predetermined pattern.

SUMMARY OF THE INVENTION

Thus, the present invention is made to solve the above problem and it is an object of the present invention to provide an inkjet printer that can perform printing by discharging a liquid easily even if the liquid has a high viscosity such as a paste-like resist material.

According to the present invention, there is provided an inkjet printer having a liquid ejecting head comprising: a liquid chamber filled with liquid and connected to a liquid storage tank; a capillary nozzle connected to the liquid chamber; a discharge unit for acting the liquid filled in the liquid chamber to eject the liquid through an outlet (discharge port) of the capillary nozzle toward an object to be printed; and a negative pressure generating unit for applying a negative pressure in the direction in which the liquid is ejected from the outlet of the capillary nozzle.

The negative pressure generating unit comprises an air nozzle which is opened at a position in the vicinity of the outlet of the capillary nozzle so that a pressurized air is discharged from the air nozzle in the direction in which the liquid is ejected.

The inkjet printer further comprises a covering member which defines a generally U-shaped groove, a cross-sectional configuration thereof having a diameter larger than that of the outlet (discharge port) of the capillary nozzle. The covering member has a bottom of the generally U-shaped groove at which the outlet of the capillary nozzle is opened and respective walls to enclose the outlet of the capillary nozzle.

The negative pressure generating unit comprises an air nozzle which penetrates through the wall and is opened at a position in the vicinity of the outlet of the capillary nozzle so that pressurized air is discharged from the air nozzle in the direction in which the liquid is ejected.

The inkjet printer further comprises a control unit for controlling both a timing of an air injection from the air nozzle and a timing of liquid injection from the outlet of the capillary nozzle.

The discharge unit comprises a piezoelectric element which deforms to pressurize the liquid filled in the liquid chamber to eject the liquid through an outlet of the capillary nozzle.

According to the another aspect of the present invention, there is provided an inkjet printer having a liquid injecting head comprising: a plurality of liquid chambers, each filled with liquid and connected to a common liquid storage tank; a plurality of capillary nozzles connected to the liquid chambers, respectively; a discharge unit for acting the liquid filled in the respective liquid chambers to eject the liquid through respective outlets (discharge ports) of the capillary nozzles toward an object to be printed; and a negative pressure generating unit for applying a negative pressure in a direction to which the liquid is ejected from the outlet of the capillary nozzle.

The negative pressure generating unit comprises a plurality of air nozzles, which are opened at positions in the vicinity of the outlets of the capillary nozzles so that pressurized air is discharged from the air nozzle in the direction in which the liquid is ejected.

The inkjet printer further comprises a covering member which defines a generally U-shaped groove, a cross-sectional configuration thereof having a diameter larger than that of the each outlet of the capillary nozzle, the covering member having a bottom of the generally U-shaped groove at which the outlets of the capillary nozzle are opened and respective walls to enclose the outlets of the capillary nozzles.

The outlets of the capillary nozzles are arranged equidistantly along a center line of the bottom of the generally U-shaped groove.

The outlets of the capillary nozzles are arranged in staggered along a longitudinal direction on the bottom of the generally U-shaped groove.

The negative pressure generating unit comprises a plurality of air nozzles which penetrate through the respective walls of the covering member and open at positions in the vicinity of the outlets of the capillary nozzles so that pressurized air is discharged from the air nozzle in the direction in which the liquid is ejected.

The inkjet printer further comprises a control unit for controlling both a timing of an air injection from the respective air nozzle and a timing of liquid injection from the respective outlet of the capillary nozzle.

The discharge unit comprises a plurality of piezoelectric elements which selectively deform to pressurize the liquid filled in the respective liquid chambers to eject the liquid though the outlets of the capillary nozzles.

As the inkjet printer according to the present invention is provided with not only a discharge mechanism for discharging a liquid contained in a liquid chamber from a discharge port, but also a negative pressure mechanism for applying negative pressure to the discharge port to draw the liquid from the discharge port, the liquid can be discharged smoothly even if it has a high viscosity. Therefore, it has a remarkable effect in that printing can be performed with high accuracy and so on.

BEST MODE FOR CARRYING OUT THE INVENTION

Hereinafter, some preferred embodiments of an inkjet printer according to the present invention will be described with reference to the accompanying drawings.

Figure 1:
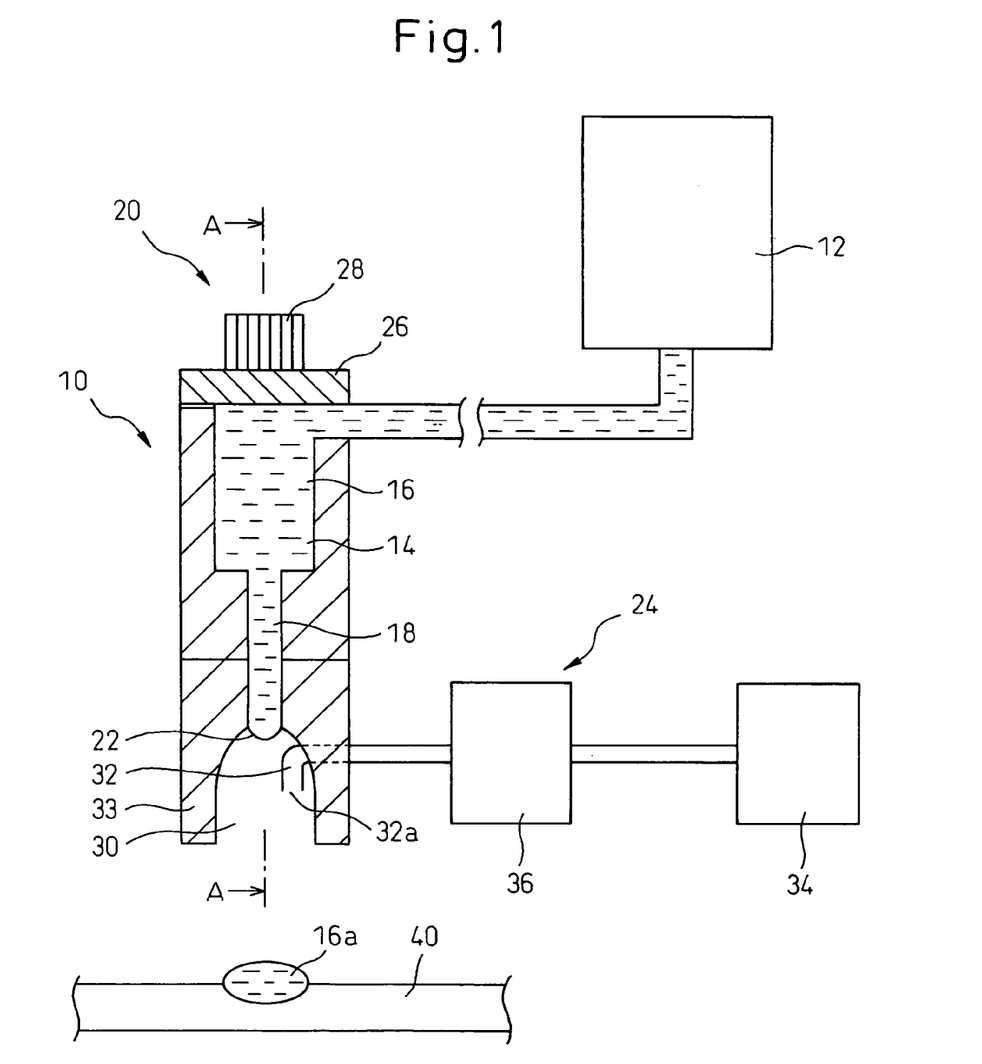
FIG. 1 is a schematic cross-sectional view showing a configuration of an embodiment of an inkjet discharge head according to the present invention.
Figure 2:
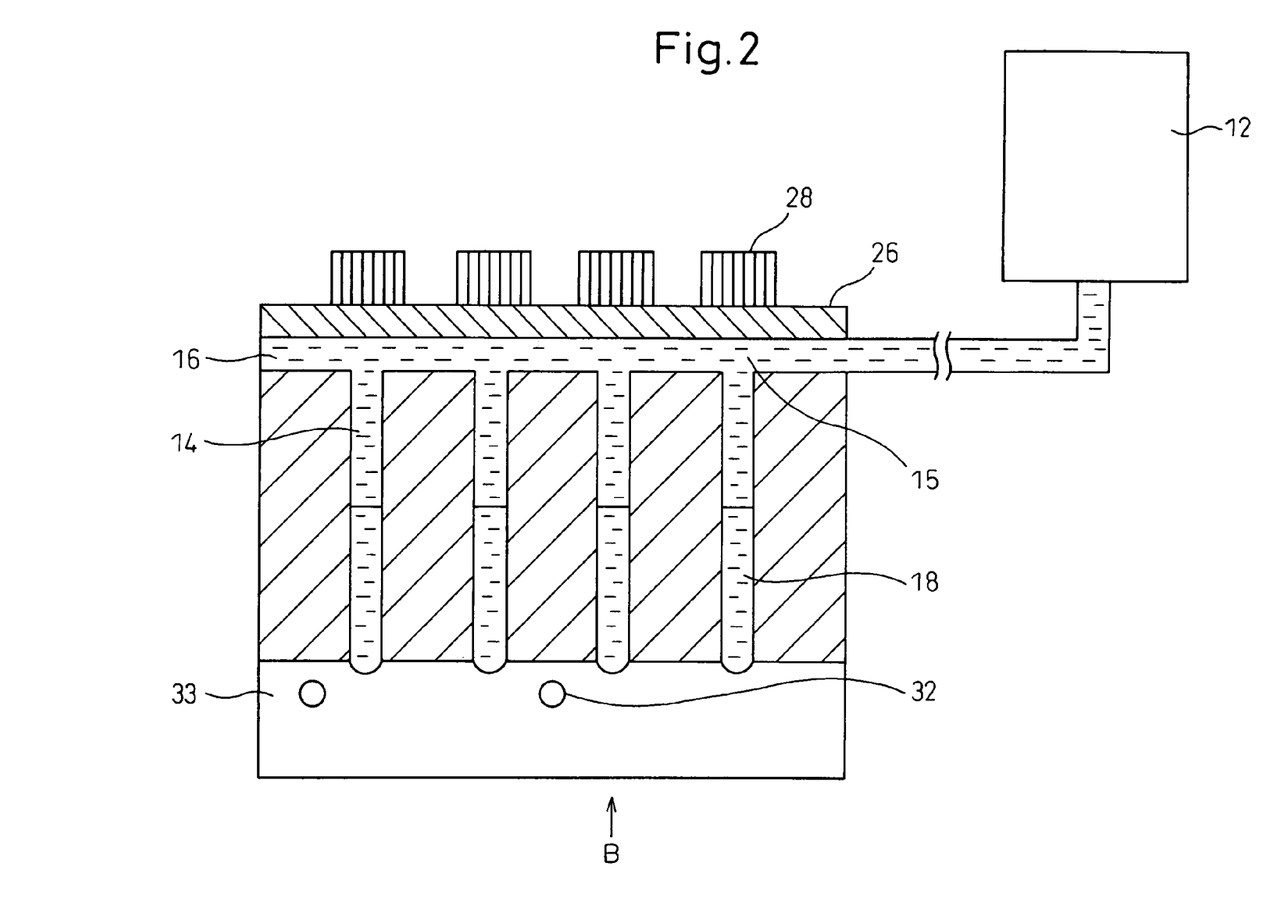
FIG. 2 is cross-sectional view taken along A-A in FIG. 1.
Figure 3:
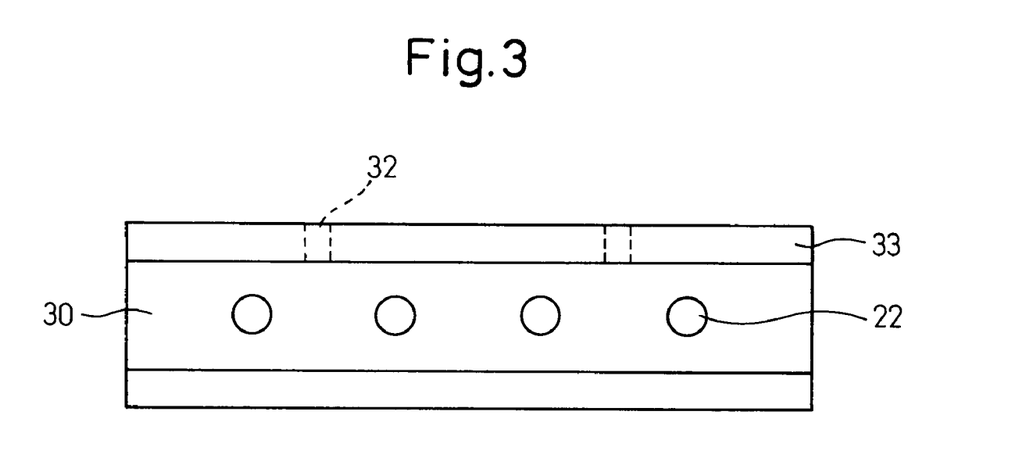
FIG. 3 is a view showing the arrangement of the nozzles seen from an arrow B in FIG. 2.

FIG. 1 is an explanatory view showing a configuration of an embodiment of a discharge head that is included in an inkjet printer according to the present invention; FIG. 2 is cross-sectional view taken along A-A in FIG. 1; and FIG. 3 is a view showing the arrangement of the nozzles seen from an arrow B in FIG. 2.

The discharge head 10 of this embodiment comprises: a liquid chamber 14 that communicates with a liquid storage tank 12 and that is filled with a printing liquid 16; a capillary nozzle 18 for discharging the liquid 16 in the liquid chamber 14; a discharge port 22 for allowing the liquid 16 contained in the liquid chamber 14 to be discharged through the discharge port 22 of the capillary nozzle 18; and a negative pressure mechanism 24 for exerting negative pressure in the direction to discharge the liquid 16 outwardly from the discharge port 22.

Further, there is also provided a discharge mechanism 20 that, in general, may discharge the liquid 16 either by pressurizing the liquid 16 in the liquid chamber 14 using a piezoelectric element or by using bubbles generated when the liquid in the liquid chamber 14 is heated.

The discharge head 10 of this embodiment uses a piezoelectric element wherein, as shown in FIG. 1, a portion of a wall that forms the liquid chamber 14 is shaped as a diaphragm 26 and a piezoelectric element 28 is attached to an outer surface of the diaphragm 26. The piezoelectric element 28 vibrates the diaphragm 26 upon energization so as to compress the liquid chamber 14 and discharge the liquid 16 through the discharge port 22, so that the jet ink droplet 16a is transfered onto the surface of a printing sheet or the copper foil 40.

In the discharge head 10, the capillary nozzle 18 that extends from the liquid chamber 14 is formed. The capillary nozzle 18 is configured so that, in a normal state in which the liquid is not discharged, the capillary nozzle 18 is filled with the liquid 16 and a meniscus is formed at the discharge port 22 of the capillary nozzle 18, as shown in FIG. 1.

The discharge head 10 of the present invention is provided with the negative pressure mechanism 24 at the discharge port 22 of the capillary nozzle 18 so that a constant volume of droplets can always be discharged even if the liquid has a high viscosity. Hereinafter, the negative pressure mechanism 24 of this embodiment will be described in detail.

On the side of the discharge port 22 of the capillary nozzle 18, there is provided a covering 33 having a larger diameter than the capillary nozzle 18 to form a space portion 30 that communicates with the capillary nozzle 18. An air nozzle 32 is introduced into this space portion 30 from outside so that negative pressure is exerted on the discharge port 22 by blowing air from the air nozzle 32.

Thus, as the negative pressure is exerted on the discharge port 22 to draw the liquid 16 from the discharge port 16 by blowing the air from the air nozzle 32, the liquid 16 can be discharged smoothly even if it has a high viscosity.

In this connection, in this embodiment, a tip 32a of the air nozzle 32 is disposed in the proximity of the discharge port 22 and directed in the direction in which the liquid 16 is discharged. It has an effect of drawing out the liquid properly.

Further, in contrast to the conventional case, in which the discharged liquid may be blown by the air occurring in the printer and, as a result, print positions may deviate, in this embodiment, as the covering member 33 provided on the side of the discharge port 22 of the capillary nozzle 18 covers the discharged droplets to prevent the effect of the air flow in the printer, accuracy of the print positions can be improved.

Still further, as the printing can be performed even if the liquid has a higher viscosity, a liquid 16 at a temperature lower than in the conventional case can be used for printing.

Still further, as an injection force of the droplets 16a can be increased by applying the negative pressure to the discharge port 22, the printer of this embodiment is not susceptible to outside air and, therefore, it can perform printing even with some distance between the tip of the discharge head 10 and the printed object 40.

Figure 4:
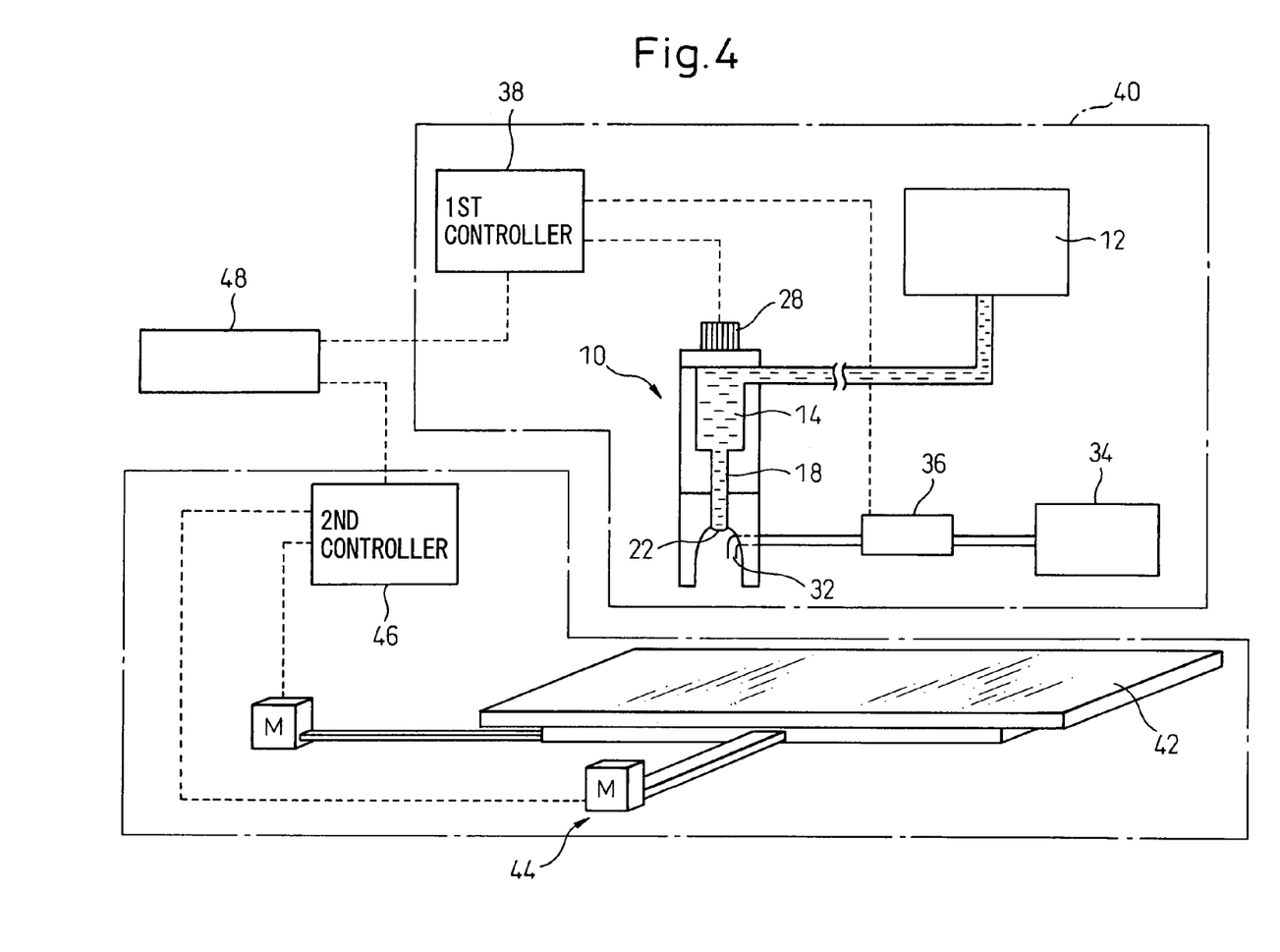
FIG. 4 is a schematic explanatory view showing an example of use of an inkjet discharge head according to the present invention.

The air nozzle 32 communicates with a high pressure air tank 34, which is disposed outside the discharge head 10, via a valve 36. The valve 36 is electrically connected to a first control section 38 for controlling the opening/closing of the valve 36, as shown in FIG. 4.

As shown in FIGS. 2 and 3, the discharge head of this embodiment comprises a plurality of liquid chambers 14, each filled with liquid and connected to a common liquid storage tank 12. A plurality of capillary nozzles 18 are connected to the liquid chambers 14, respectively. A plurality of piezoelectric elements 28 are provided for the respective liquid chambers 14 to act the liquid 16 filled therein to discharge or eject the liquid through the respective discharge ports 22 toward an object to be printed.

The covering member 33 defines a generally U-shaped groove having a bottom at which the discharge ports 22 of the capillary nozzle are opened and equi-distantly arranged along a center line of the bottom of the generally U-shaped groove.

A plurality of air nozzles 32 penetrate through the respective walls of the covering member 33 and are opened at positions in the vicinity of the discharge ports 22 of the capillary nozzles.

The first control section 38 controls not only the opening/closing of the valve 36 but also energization of the piezoelectric element 28 of the discharge head 10. Therefore, the liquid 16 can be discharged by controlling the timing to open the valve 36 so as to eject air from the air nozzle 32 and the timing to eject the liquid by the piezoelectric element 28. Hereinafter, an operation of the discharge head 10 when the liquid 16 is discharged will be described with reference to FIGS. 5(a)-5(d).

Figure 5A:
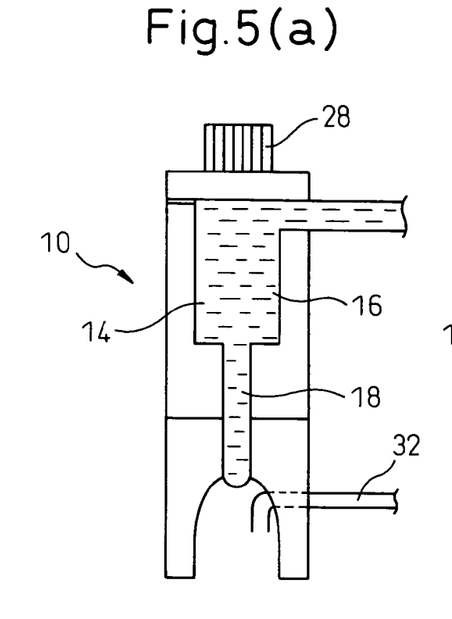
FIGS. 5(a)-5(d) are operation explanatory views showing an operation of an inkjet discharge head according to the present invention.

FIG. 5(a) is a state diagram showing the discharge head 10 in the normal state.

Figure 5B:
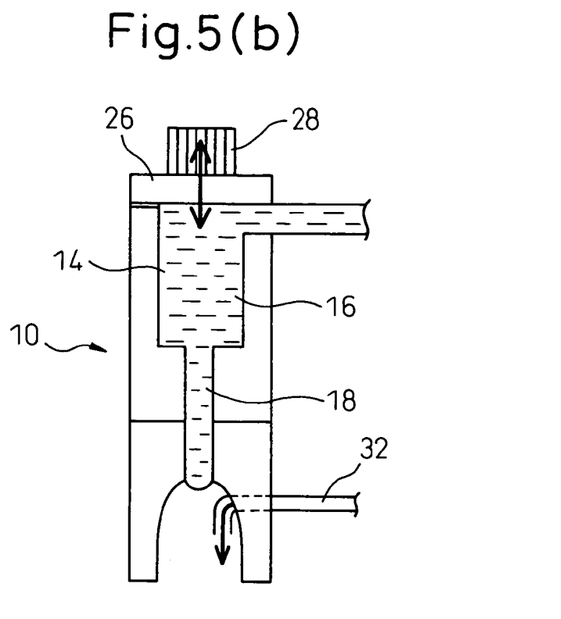
Figure 5C:
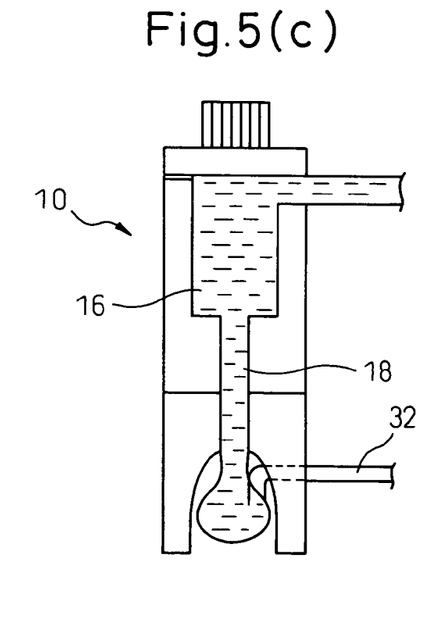
Figure 5D:
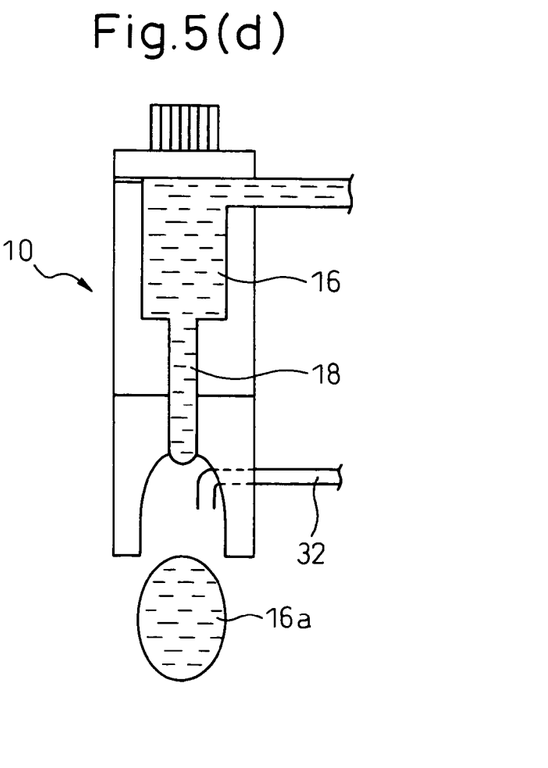

As shown, in the normal state, the discharge head 10 is filled with the liquid 16 up to the discharge port 22 of the capillary nozzle 18. When the liquid is to be discharged, the first control section 38 energizes the piezoelectric element 28 and, at the same time, opens the valve 36. Therefore, as shown in FIG. 5(b), the piezoelectric element 28 vibrates the diaphragm 26 so as to pressurize the liquid chamber 14 and, on the other hand, the valve 36 is opened so that the air blows out of the air nozzle 32 to apply the negative pressure to the discharge port 22. As a result, the liquid 16 is drawn from the discharge port 22, as shown in FIG. 5(c), and a constant volume of the droplet 16a is discharged, as shown in FIG. 5(d).

As described above, in this embodiment, as the droplet 16a is discharged not only by the force due to the piezoelectric element 28 to compress the liquid chamber 14 to discharge the liquid 16 but also by the force to apply the negative pressure to the discharge port 22 to discharge the liquid 16, the liquid 16 can be discharged smoothly even if it has a high viscosity and, thus, the printing can be performed preferably. In this connection, the air blowing out of the air nozzle 32 can be adjusted by the first control section 38 according to the viscosity of the liquid 16.

The inkjet printer 40 comprising the discharge head 10 of this embodiment can be used for forming wiring patterns on printed wiring boards by using a resist material as the liquid 16.

The resist material used for printing has a higher viscosity than ink. Therefore, it is difficult to perform printing by an inkjet printer including a conventional discharge head (for example, the discharge head 100 shown in FIG. 8). However, the discharge head 10 of this embodiment, which discharges the liquid 16 by using both the discharge mechanism 20 and the negative pressure mechanism 24, can perform printing preferably even if the liquid has a high viscosity.

Therefore, once the print data corresponding to the printed wiring boards is input to a computer 48 (FIG. 4), the resist pattern can be formed easily by printing. Further, as the printer of this embodiment can perform printing precisely, fine patterns can also be formed with high accuracy.

FIG. 4 shows a schematic configuration of an apparatus for forming a resist pattern on a board 42 by printing. In this embodiment, as shown, the first control section (controller) 38 that is included in the printer 40 for controlling the discharge head 10 and a second control section (controller) 46 that is included in a board transfer mechanism 44 for controlling a motor and the like to move the copper-layered board 42 are connected to the computer 48, respectively, and the printer 40 and the board transfer mechanism 44 cooperate to perform printing. Therefore, the resist pattern can be formed easily by inputting the image data to the computer 48.

In this connection, though the printer 40 of this embodiment can be used to form a printed wiring board having a predetermined wiring pattern by forming the predetermined pattern of the resist material on the copper-layered board by printing as described above, it can also be used, of course, as an inkjet printer using typical ink.

Further, in this embodiment, though the discharge mechanism 20 of the discharge head 10 uses the piezoelectric element 28 for pressurizing the liquid chamber 14, the discharge mechanism of the present invention is not limited to this configuration and it may use a heater for heating the liquid chamber to discharge the liquid.

Figure 6:
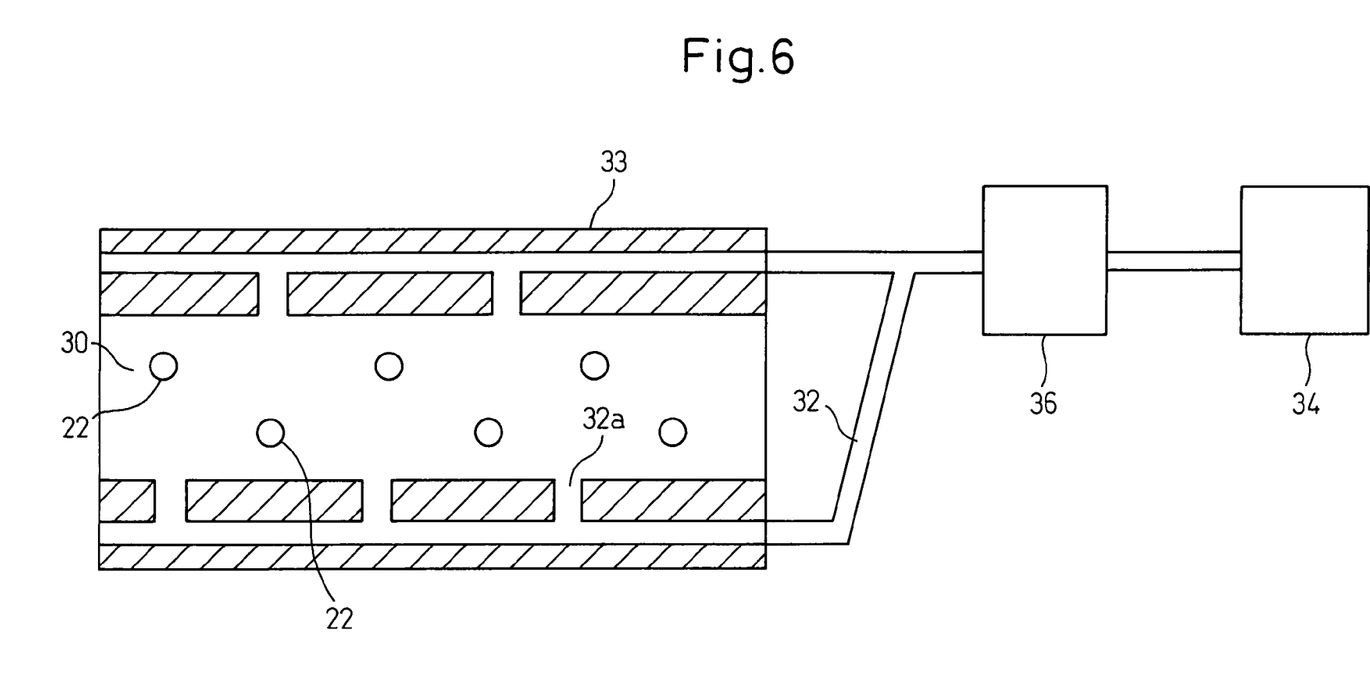
FIG. 6 is a view showing the arrangement of the nozzles in another embodiment of an inkjet discharge head according to the present invention.

FIG. 6 is a view showing the arrangement of the nozzles in another embodiment of a discharge head of this invention. In this embodiment, a plurality of discharge ports 22 of the capillary nozzles are arranged in a staggered array along a longitudinal direction on the bottom of the generally U-shaped groove of the covering member 33.

On the other hand, a plurality of air nozzles 32a are arranged so as to penetrate through the respective walls of the covering member 33 and are opened at positions in the vicinity of the discharge ports 22 of the capillary nozzles so that a pressurized air is discharged from the air nozzle 32a in the direction in which the liquid is ejected.

Figure 7A:
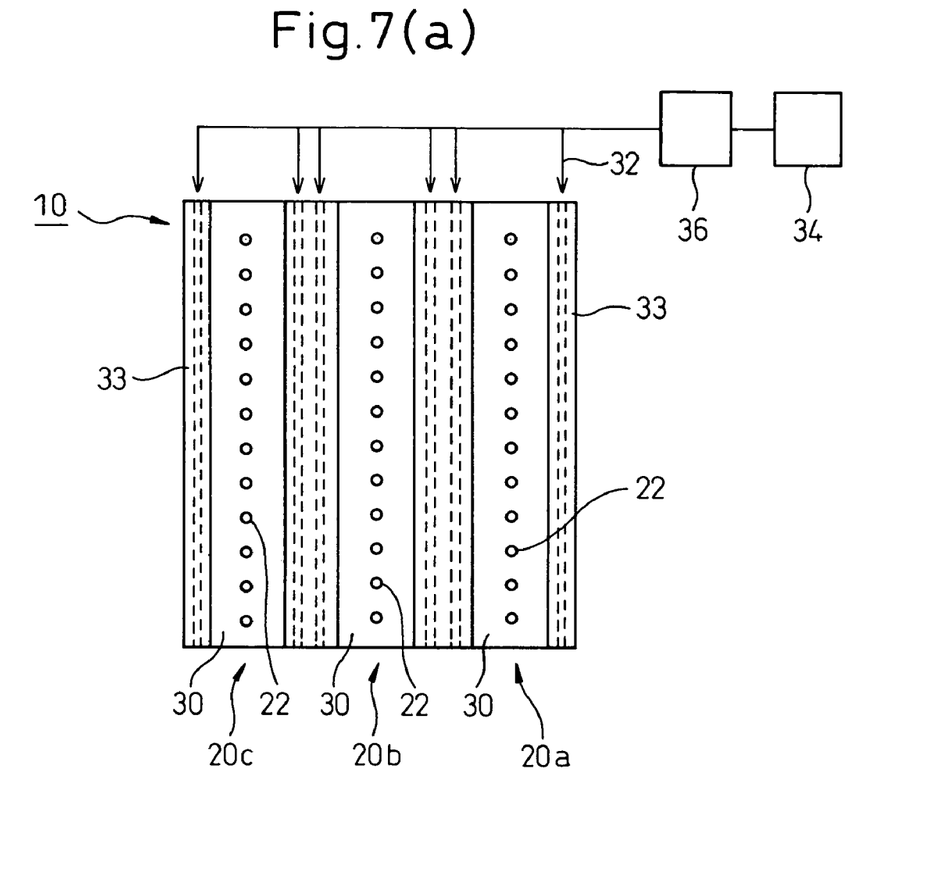
FIGS. 7(a) and 7(b) are views showing the arrangement of the nozzles in still another embodiment of an inkjet discharge head according to the present invention.
Figure 7B:
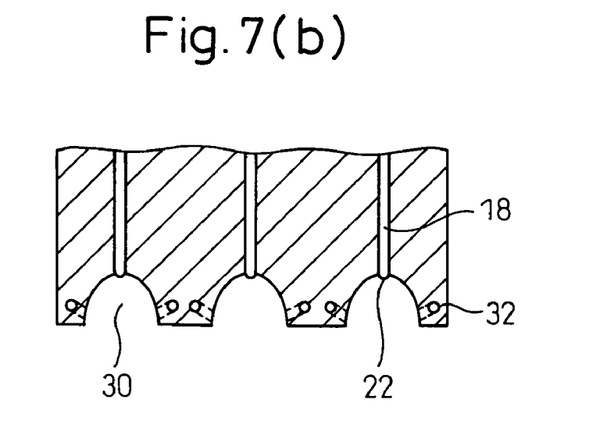

FIGS. 7(a) and 7(b) are views showing the arrangement of the nozzles in still another embodiment of an inkjet discharge head of this invention. In this embodiment, a plurality of discharge ports 22 of the capillary nozzles are arranged along a center line of the respective U-shaped grooves of the covering member 33. In addition, the U-shaped grooves are arranged in several rows. A pressurized air is discharged from the air nozzles 32a provided in the respective walls with respect to the U-shaped grooves of the covering member 33.

It should be understood by those skilled in the art that the foregoing description relates to only some of the preferred embodiments of the disclosed invention, and that various changes and modifications may be made to the invention without departing the sprit and scope thereof. For example, the air can be ejected continuously from the respective discharge outlets 32a, although the timing of liquid injection from the respective outlets of the capillary nozzles is controlled.

The invention claimed is:

1. An inkjet printer having a liquid injecting head comprising:
   a liquid chamber filled with liquid and connected to a liquid storage tank;
   a capillary nozzle connected to said liquid chamber;
   a discharge unit comprising a piezoelectric element which deforms to pressurize the liquid filled in said liquid chamber to thereby eject the liquid through an outlet of said capillary nozzle toward an object to be printed, wherein the liquid is ejected substantially perpendicular to the object;
   a negative pressure generating unit comprising an air nozzle located at a position in a vicinity of said outlet of the capillary nozzle and thereby being enclosed in a same opening, and applying a negative pressure via air injection through the air nozzle initially in a same direction in which the liquid is ejected from said outlet of the capillary nozzle; and
   a control unit controlling both a timing of the air ejection through the air nozzle, and a timing of liquid ejection through said outlet of said capillary nozzle by the piezoelectric element,
   wherein said air nozzle discharges pressurized air in the direction in which the liquid is ejected.

2. An inkjet printer as set forth in claim 1 further comprising a covering member which defines a generally U-shaped groove, a cross-sectional configuration thereof having a diameter larger than that of said outlet of the capillary nozzle, said covering member has a bottom of said generally U-shaped groove, at which said outlet of the capillary nozzle is opened, and respective walls to enclose said outlet of the capillary nozzle.

3. An inkjet printer as set forth in claim 2, wherein said air nozzle penetrates through said respective walls of said covering member.

4. An inkjet printer having a liquid injecting head comprising:
- a plurality of liquid chambers, each filled with liquid and connected to a common liquid storage tank;
- a plurality of capillary nozzles connected to said liquid chambers, respectively;
- a discharge unit comprising a plurality of piezoelectric elements which deform to pressurize the liquid filled in said plurality of liquid chambers to thereby eject the liquid through respective outlets of said capillary nozzles toward an object to be printed, wherein the liquid is ejected substantially perpendicular to the object;
- a negative pressure generating unit comprising a plurality of air nozzles located at positions in a vicinity of said respective outlets of said capillary nozzles and thereby being enclosed in same respective openings, and applying a negative pressure via air injection through the plurality of air nozzles initially in a same direction in which the liquid is ejected from said respective outlets of said capillary nozzles; and
- a control unit for controlling both a timing of the air ejection through the plurality of air nozzles, and a timing of liquid ejection through said respective outlets of said capillary nozzles by the piezoelectric elements,
wherein said plurality of air nozzles discharge a pressurized air in the direction in which the liquid is ejected.

5. An inkjet printer as set forth in claim 4 further comprising a covering member which defines a generally U-shaped groove, a cross-sectional configuration thereof having a diameter larger than that of each of said respective outlets of said capillary nozzles, said covering member having a bottom of said generally U-shaped groove, at which said respective outlets of said capillary nozzles are opened, and respective walls to enclose said respective outlets of said capillary nozzles.

6. An inkjet printer as set forth in claim 5, wherein said respective outlets of said capillary nozzles are arranged equidistantly along a center line of the bottom of the generally U-shaped groove.

7. An inkjet printer as set forth in claim 5, wherein said respective outlets of the capillary nozzles are arranged in a staggered array along a longitudinal direction on the bottom of the generally U-shaped groove.

8. An inkjet printer as set forth in claim 5, wherein said plurality of air nozzles penetrate through said respective walls of the covering member.

* * * * *

UNITED STATES PATENT AND TRADEMARK OFFICE
CERTIFICATE OF CORRECTION

PATENT NO. : 7,524,025 B2 Page 1 of 1
APPLICATION NO. : 10/901051
DATED : April 28, 2009
INVENTOR(S) : Kei Murayama It is certified that error appears in the above-identified patent and that said Letters Patent is hereby corrected as shown below:

Column 3, Line 60, change "transfered" to --transferred--.

Signed and Sealed this

Eighth Day of September, 2009

David J. Kappos
*Director of the United States Patent and Trademark Office*